(12) United States Patent
Berek et al.

(10) Patent No.: US 8,728,572 B2
(45) Date of Patent: May 20, 2014

(54) METHOD FOR CONSTRUCTING CONTACT ELEMENT FOR MULTI-LAYER SYSTEM

(75) Inventors: Harry Berek, Oberschoena (DE); Alexander Paul, Freiberg (DE); Steffen Schmidt, Freiberg (DE); Lothar Herlitze, Derenthal (DE); Hansjoerg Weis, Hoexter (DE); Karl Haeuser, Beverungen (DE)

(73) Assignees: Interpane Entwicklungs-und Beratungsgesellschaft mbH, Lauenfoerde (DE); GFE Fremat GmbH, Freiberg (DE)

( * ) Notice: Subject to any disclaimer, the term of this patent is extended or adjusted under 35 U.S.C. 154(b) by 872 days.

(21) Appl. No.: 12/740,425

(22) PCT Filed: Oct. 16, 2008

(86) PCT No.: PCT/EP2008/008778
§ 371 (c)(1),
(2), (4) Date: Aug. 30, 2010

(87) PCT Pub. No.: WO2009/056235
PCT Pub. Date: May 7, 2009

(65) Prior Publication Data
US 2010/0326512 A1 Dec. 30, 2010

(30) Foreign Application Priority Data

Nov. 2, 2007 (DE) .......................... 10 2007 052 414
Jun. 11, 2008 (DE) .......................... 10 2008 027 770

(51) Int. Cl.
*B05D 5/12* (2006.01)
*B05D 1/12* (2006.01)
*B05D 1/38* (2006.01)

(52) U.S. Cl.
USPC ........... 427/192; 427/97.3; 427/191; 427/427

(58) Field of Classification Search
USPC ................................. 427/97.3, 191, 192, 427
See application file for complete search history.

(56) References Cited

U.S. PATENT DOCUMENTS

| | | | |
|---|---|---|---|
| 5,888,902 A | 3/1999 | Jun | |
| 6,162,649 A | 12/2000 | Kweon et al. | |
| 7,125,586 B2 * | 10/2006 | Van Steenkiste et al. | ...... 427/448 |
| 2002/0122894 A1 * | 9/2002 | Brenner et al. | ............... 427/558 |

FOREIGN PATENT DOCUMENTS

| | | |
|---|---|---|
| DE | 100 45 783 A1 | 11/2001 |
| DE | 101 62 276 A1 | 7/2003 |
| DE | 103 20 740 A1 | 12/2004 |
| DE | 10 2004 059 716 B3 | 4/2006 |

(Continued)

OTHER PUBLICATIONS

Lima, R.S. et al., "Microstructural characteristics of cold-sprayed nanostructured WC-Co coatings", Thin Solid Films (2002), vol. 416, pp. 129-135.

*Primary Examiner* — Frederick Parker
(74) *Attorney, Agent, or Firm* — Scully, Scott, Murphy & Presser, P.C.

(57) ABSTRACT

A device and method relating to a layer system is provided. A substrate with a multi-layer system disposed on the substrate is provided. The multi-layer system has at least one upper layer and at least one layer. A contact element is applied through cold-gas spraying in such a manner that the contact element penetrates the upper layer and contacts the lower layer. The upper layer of the multi-layer system has a scratch-resistant top-layer.

14 Claims, 5 Drawing Sheets

(56) References Cited

FOREIGN PATENT DOCUMENTS

| EP | 0 484 533 B1 | 1/1995 |
| EP | 1 382 707 A1 | 1/2004 |
| EP | 1 517 597 A2 | 3/2005 |
| JP | 9-27547 | 1/1997 |
| WO | WO 03/070524 A1 | 8/2003 |

\* cited by examiner

METHOD FOR CONSTRUCTING CONTACT ELEMENT FOR MULTI-LAYER SYSTEM

BACKGROUND

The present invention relates to a multi-layer system with a contact element and a method for constructing a contact element for a multi-layer system. The present invention relates in particular to a contact element and a method for constructing a contact element, which can also contact more deeply disposed layers.

A method for manufacturing an electrically conducting resistance layer is disclosed in DE 101 62 276 A1. For this purpose, an electrically conducting material is applied to the surface of a non-conducting substrate by means of thermal spraying. The resulting material layer still does not provide the desired shape and, following this, is therefore removed in regions in such a manner that an electrically conducting resistance layer is formed, which provides substantially the desired form. In particular, strip conductors can be created in this manner.

The disadvantage with the named method, however, is that strip conductors and electrical contacts can be created only on the top layer, that is to say, on the surface.

One method for forming a strip conductor on a carrier component, wherein the strip conductor is also present in more deeply disposed layers, is disclosed in document WO 03/070524 A1. With this method, the strip conductor is applied directly to a carrier component via a jet-bound, thermo-kinetic application method. Following this, the further layers are applied over the strip conductor.

The disadvantage with the named method is that the application of the strip conductor is very costly and is possible only during the construction of the carrier component, and does not allow a strip conductor still to be applied even after the completion of the carrier component. Furthermore, the electrical contact of the more deeply disposed strip conductor is costly.

SUMMARY

The present invention is therefore based on the object of providing a contact element for a multi-layer system and creating a method for the construction of a contact element for a multi-layer system, which is simple to realize at every processing stage and allows a simple connection of the contact element.

The present invention relates to a layer system with contact element comprising a substrate, a multi-layer system disposed on the substrate with an upper layer and a lower layer, and a contact element, which penetrates the at least one upper layer and contacts the lower layer.

By preference, the contact element is made of an electrically conductive material, preferably aluminium, copper, silver, tin, zinc, nickel, titanium or an alloy of the named materials.

The substrate can be glass.

By preference, the lower layer is an electrically conducting layer.

In one embodiment, the lower layer is, in particular, an aluminium layer, an NiV-layer, a molybdenum layer, a copper layer, a noble-metal layer or a combination of the named materials, by particular preference, a silver layer.

In a further embodiment, the lower layer (2; 3) consists of a material from the group of transparent conductive oxides, so-called TCOs, preferably $SnO_2$:F, indium tin oxide ITO, indium zinc oxide IZO, ZnO:Al, ZnO:Sb or ZnO:B.

In one preferred embodiment, the contact element is applied by means of cold-gas spraying.

By preference, the contact element partially covers the multi-layer system.

By particular preference, the contact element is formed as a strip on the multi-layer system.

In one preferred embodiment, two contact elements are formed on the multi-layer system.

In one preferred embodiment, the multi-layer system is a photovoltaic cell, in particular, a photovoltaic thin-layer cell.

In this preferred embodiment, the photovoltaic cell comprises at least two contact layers and a solar-active layer disposed between the contact layers, and the contact element penetrates at least the solar-active layer and contacts at least one of the contact layers.

The present invention further relates to a method for the construction of a contact element for a layer system comprising the steps:

provision of a substrate with a multi-layer system with at least one upper layer and one lower layer disposed on the substrate and application of a contact element by means of cold-gas spraying in such a manner that the contact element penetrates the at least one upper layer and contacts the lower layer.

In one preferred embodiment, the method comprises the provision of a device for cold-gas spraying comprising a carrier-gas chamber, a particle chamber, a powder conveyor for transporting the particles from the particle chamber into a mixing chamber and a nozzle for the application of the particle-gas mixture from the mixing chamber onto the multi-layer system.

By preference, the method comprises the provision of nitrogen $N_2$ as carrier gas.

By preference, the method comprises the provision of aluminium particles as powder.

By preference, the method comprises the provision of a carrier-gas temperature from 100° C. to 500° C., by preference of 400° C.

By preference, the method comprises the provision of a carrier-gas pressure from 5 bar to 30 bar, preferably from 5 bar to 25 bar, by particular preference, of 15 bar.

By preference, the method comprises the provision of a relative velocity of the nozzle of the device for the cold-gas spraying relative to the substrate with the multi-layer system of 10 m/min.

By preference, the method comprises the provision of a powder-conveyor rate of the device for cold-gas spraying (13) from 5 to 70 g/min, preferably from 10 to 20 g/min.

By preference, the method comprises the provision of a spacing distance between the nozzle of the device for cold-gas spraying and the multi-layer system from 20 mm to 30 mm, by particular preference, of 25 mm.

BRIEF DESCRIPTION OF THE DRAWINGS

Particularly preferred exemplary embodiments of the invention are explained in greater detail below with reference to the drawings. The drawings are as follows.

DETAILED DESCRIPTION OF EXEMPLARY EMBODIMENTS

Figure 1:
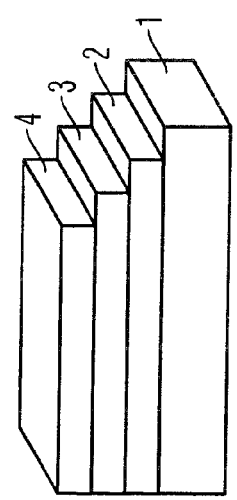
FIG. 1 shows the principle of the structure of a multi-layer system.

FIG. 1 shows the basic layer structure of a layer system according to the present invention. A multi-layer system 14 is applied to a substrate 1, wherein the multi-layer system 14 comprises a bottom layer 2, an intermediate layer 3 and a top layer 4. For this purpose, a bottom layer 2 is first applied. Above this, an intermediate layer 3 and finally a top layer 4 is applied. According to the terminology of the present invention, each of the named layers, that is, the bottom layer 2, the intermediate layer 3 and/or the top layer 4, can consist of one or more layers, films and/or coatings.

A multi-layer system manufactured using thin-layer technology of this kind is well established in many branches of industry within the framework of surface functionalisation. For example, in the fields of architecture and the automotive industry, on a large scale, glass is provided with a 50-150 nanometer thick functional layer, which ensures thermal insulation or protection from sunlight. This functional layer consists of a layer stack of extremely diverse materials. In many layer systems, silicon nitride is used as a scratch-resistant top layer. In this context, the deposition of thin layers is implemented on a large scale via magnetron sputtering, a PVD process (physical vapour deposition). Layers made of noble metals, for example, silver are responsible for the optical properties.

Figure 2A:
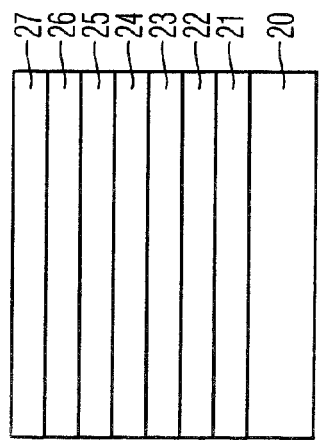
FIGS. 2a-2c show 3 examples of a multi-layer system in different applications.
Figure 2C:
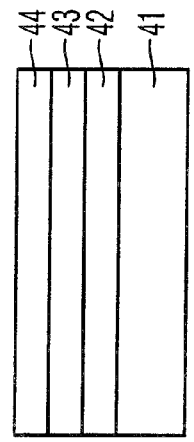
Figure 2B:
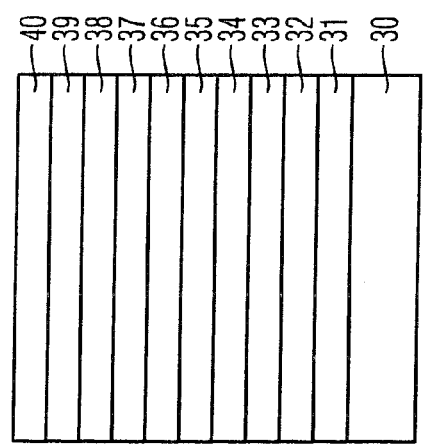

FIGS. 2a-2c show special examples for multi-layer systems for various applications.

FIG. 2a shows one example of a thermal-insulation layer, a so-called single low-E layer. In this case, a layer of titanium dioxide 21 is initially applied to a substrate 20, in the present case glass, above this, a layer of tin dioxide 22 and above that a layer of zinc oxide 23. Following this, a silver layer 24 and a protective layer 25 are applied. Above the protective layer, a further tin dioxide layer 26 is provided with silicon nitride 27 as a top layer.

FIG. 2b shows a further example of a multi-layer system for thermal insulation in the embodiment of a double low-E multi-layer system. In this context, a layer of titanium dioxide 31 is also initially provided over the substrate 30. As in FIG. 2a, a layer of silicon nitride 40 forms the top layer. The layers disposed between these are each provided twice. Accordingly, above the titanium dioxide layer 31, a zinc oxide layer 32 is provided, following this, a silver layer 33, above this, a protective layer 34 and following this a tin dioxide layer 35. This structure is repeated in the next stage, in that, once again, on the tin dioxide layer 35, a zinc oxide layer 36, following this a silver layer 37, above this, a protective layer 38 and as the final layer under the top layer 40, a tin dioxide layer 39 is provided.

FIG. 2c shows a layer structure for a sunlight protection layer on glass. In this context, on the substrate 41, which is glass in the present case, tin dioxide 42 is applied as a bottom layer, above this chromium nitride 43 is applied as an intermediate layer and silicon nitride 44 as a top layer.

However, other layer structures are possible. In particular, silver-based layer systems, as in the examples just named can be provided with one or more electrically insulating or partially electrically insulating top layers. Examples of conventional top layers include $Si_3N_4$, but also materials such as $SnZnO_x$, $SnO_x$, $BiO_x$, $TiO_x$, $SiO_x$, AlN or other materials.

The multi-layer systems can also be based upon the group of so-called TCOs (transparent conducting oxides). In this context, applications are, for example, multi-layer systems for liquid-crystal screens, LEDs or touchscreens.

The idea of the present invention is to contact the electrically conductive layers electrically within the multi-layer systems. This allows a multiplicity of different applications. For example, the surface resistance heating of panes of glass is made possible by contacting the electrically conducting layer. A further application is a burglar proofing of panes of glass in the form of conductor loop, so that, for example, in a case of destruction of the pane of glass and the associated destruction of the conductor loop, an alarm is triggered. In a further application, an electrically conductive layer contacted at the edge within a multi-layer system can serve as a part of a photovoltaic arrangement.

The electrically conductive layer, which is to be contacted, can be a silver layer, an aluminium layer, a NiV layer, a molybdenum layer, a copper layer, another metallic layer or a combination of several of the named materials; it can also consist of a material from the group of the already named TCOs (transparent conducting oxides), such as, $SnO_2$:F, ITO (indium tin oxide), IZO (indium zinc oxide), ZnO:Al, ZnO:Al, ZnO:Sb or ZnO:B. Contacting is also possible for TCOs. Moreover, every multi-layer system with one or more of the above named electrically conductive materials is covered by the present invention.

In order to contact more deeply disposed electrically conductive layers within a multi-layer system, conventional thermal spraying methods are not suitable. These operate with coating materials, which are accelerated in the molten condition towards the substrate. In the case of coated glass, this is associated with unacceptably high thermal stress.

In the contacting of solar cells, various methods have been established dependent upon the cell type: in the case of photovoltaic cells based on silicon wafers, the solar-active layer stack is often contacted using a screen printing method, by applying an Ag-conductive paste with a subsequent stoving process at temperatures between 600° C. and 1000° C. Here also, the coating is associated with a high thermal stress.

According to the present invention, cold-gas spraying is used. The method according to the invention therefore allows a significantly gentler process with regard to the thermal stress on the previously deposited layer system.

Cold-gas spraying is a special method of thermal spraying. In this context, powder particles are accelerated in a "cold" gas jet in such a manner that they strike the substrate at supersonic velocity, thereby forming a firmly adhering coating. That is to say, the coating is formed by the collision of the particles on the substrate with a high kinetic energy. The fusion temperature of the particles in this context is not reached under standard conditions. At the point of impact, the particles, which do not melt in the cold gas-jet, therefore form a dense and adhesive layer, wherein plastic deformation and the associated local release of heat ensure cohesion and adhesion of the sprayed layer on the substrate.

The advantages of cold-gas spraying are, on the one hand, as already mentioned, that the fusion temperature of the particles is not reached, and the thermal stress on the multi-layer system is not significant. On the other hand, cold-gas spraying is characterised by low porosity and a low oxygen content. In particular, this means that the electrical and thermal conductivity of metallic layers, which have been applied by means of cold-gas spraying, achieve approximately the values of compact materials.

Figure 3:
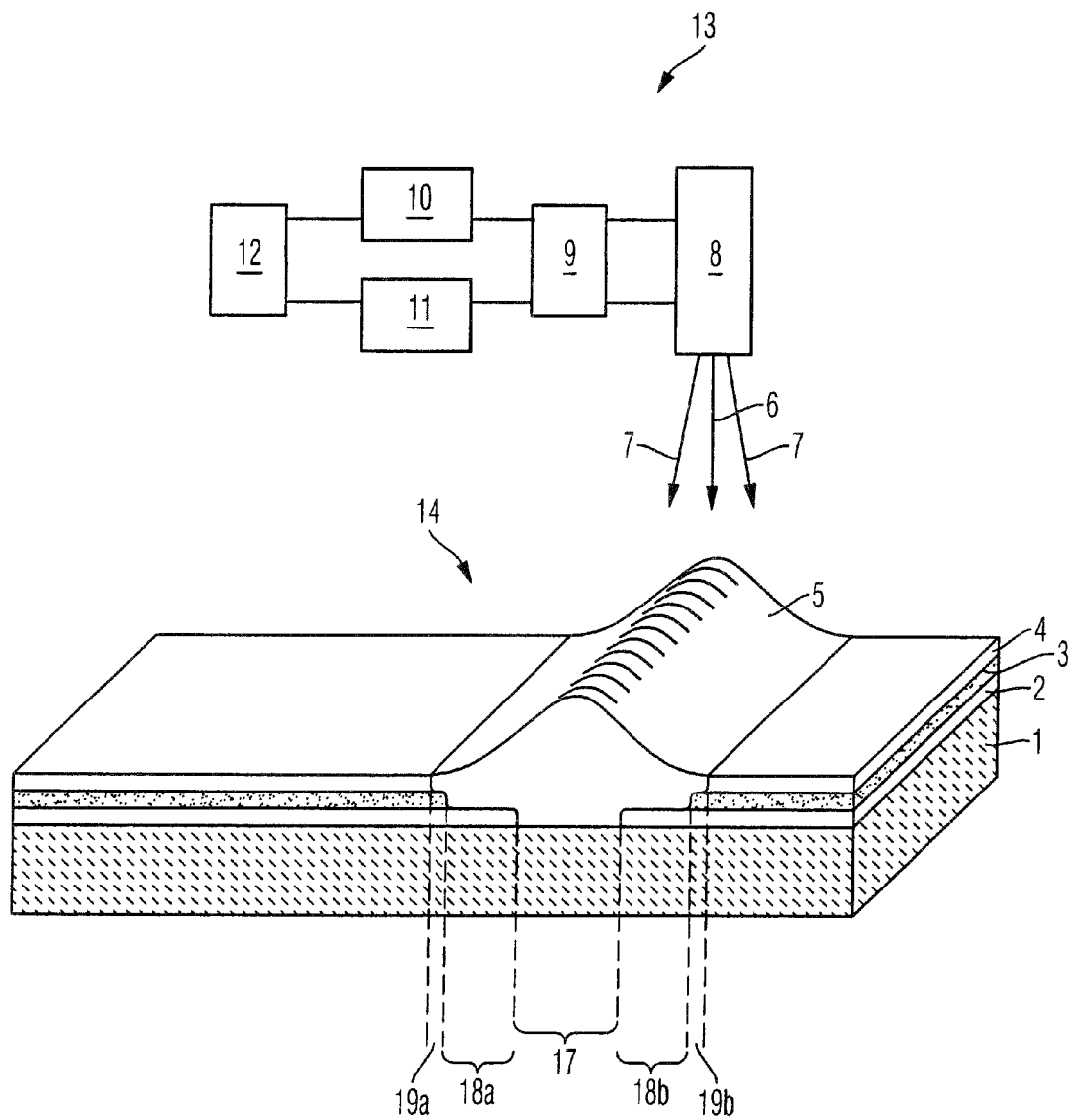
FIG. 3 shows a multi-layer system with contact element according to the present invention and a device for the construction of such a multi-layer system with contact element according to the present invention.

A device for cold-gas spraying 13 is illustrated schematically in FIG. 3. In this context, a control unit 12 monitors the processes and functionalities of the individual components. For example, the control unit 12 can monitor the turning on and off of the device for cold-gas spraying 13, and control individual components or valves. The carrier gas is stored in a gas chamber 11 under pressure. The spray particles are stored in a particle chamber 10 and are transferred via a rotary conveyor into a mixing chamber 9. After the opening of corresponding valves by the control unit 12, the gas is forced from the gas chamber 11 into the mixing chamber 9.

The gas-particle mixture is then accelerated via a nozzle 8 in the direction towards the substrate to be coated.

Heating the gas jet warms the particles for improved plastic deformation upon impact and increases the flow velocity of the gas and therefore also the velocity of the particles. The gas temperatures used in this context are disposed significantly below the fusion temperature both of the substrate to be coated and also of the powder particles. The powder particles receive the high kinetic energy upon the release of the gas. After the injection of the powder particles into the gas jet in the mixing chamber 9, the gas is released into a nozzle 8, wherein the gas and powder particles are accelerated to velocities above the speed of sound. A method of this kind and a device of this kind for cold-gas spraying are described in detail in European Patent Application EP 0 484 533 B1.

The present invention proposes a special type of cold-gas spraying, in which the individual parameters have been adjusted in such a manner that it is possible with cold-gas spraying not only to apply an adhesive layer to the uppermost layer of the multi-layer system or in general to the surface of the substrate, but to penetrate the layers of the multi-layer system and to contact more deeply disposed layers. The term "contact" in the sense of the present invention describes a connection of the lower layer with the contact element in such a manner that the connection is electrically conductive. In this context, the contact element can touch the lower layer only superficially or may penetrate it entirely or in part; the important factor is merely that the connection achieves an electrical conductivity between the lower layer and the contact element.

Accordingly, the basic idea is to provide a contact element for a multi-layer system. For this purpose, at least one upper layer and one lower layer are provided on a substrate. However, further layers may also be present. In particular, the lower layer is arranged either directly on the substrate, or one or more layers are provided between the lower layer and the substrate. Similarly, the upper layer can be disposed directly on the lower layer or one or more layers can be provided between the upper and the lower layer. The present invention proposes a method for cold-gas spraying, so that the contact element applied by means of the cold-gas spraying penetrates the upper layer and contacts the lower layer.

This principle is also presented in FIG. 3. FIG. 3 shows a substrate 1, which, in the present example, is glass, a bottom layer 2 applied above it, an intermediate layer 3 disposed above that, and a top layer 4 applied above the intermediate layer. In the present example, the intermediate layer 3 is an electrically conductive layer and can be metallic and/or based upon TCOs. For example, the intermediate layer 3 can be a silver layer. By means of cold-gas spraying, a contact element 5 is applied to the system 14 in such a manner that it penetrates the top layer 4, the intermediate layer 3 and the bottom layer 2 and is applied in an adhering manner to the substrate 1. The present invention also comprises a contact element 5, which penetrates only one part of the layers applied to the substrate 1 and does not penetrate down to the substrate 1. On the contrary, the decisive factor is that the depth of penetration or the depth of entry of the contact element 5 is sufficient so that the conducting layer, in the present example, the intermediate layer 3, is contacted.

The particles propelled from the nozzle 8 in this context have different velocities. The particle velocities have a typical distribution, that is to say, the velocity is greatest in the middle. This corresponds to a depth of penetration such that a firm adhesion on the substrate 1 is achieved. The overall layer system applied to the substrate 1 is penetrated as a result of the kinetic energy of the powder particles. At the edge of the spray jet, the particle velocity reaches the value 0, and all particles are deflected with the gas stream; accordingly no further layer formation takes place. In the transitional region, a complete penetration of the layer system no longer takes place, so that a direct contact of intermediate layers is achieved.

This is explained once again in greater detail in the following section with reference to FIG. 3. The particle jet propelled from the nozzle 8 provides a core zone 6 and edge zones 7. The kinetic energy of the particles in the core zone 6 is the greatest and declines towards the edge zones 7. Dependent upon the kinetic energy, the depth of penetration of the particles also changes. The contact element 5 applied therefore provides a core region 17, in which the kinetic energy of the particles in the core zone 6 is sufficiently large to penetrate all layers of the layer system and to penetrate down to the substrate 1. In the regions of the contact element 5, which have been applied by particles from the edge zones 7 of the particle jet, the depth of penetration is reduced. Accordingly, in a first edge zone 18a, 18b, the depth of penetration of the particles is less, and no adhesion on the substrate 1 occurs. Correspondingly, further towards the edge zone 7, the depth of penetration is even less, so that in a second edge region 19a, 19b, only the uppermost layer, that is, the top layer system 4 is penetrated. Even further towards the edge of the particle stream, no further adhesion takes place.

In one advantageous embodiment, it is possible to provide a masking, which either limits the particle stream propelled from the nozzle 8, or which can be placed over the multi-layer system, so that the width of the contact element 5 is limited.

To form a contact element 5 according to the present invention on a multi-layer system, a particular adjustment of the individual parameters of the device for cold-gas spraying 13 is necessary. These parameters comprise the carrier-gas temperature, the carrier-gas pressure, the overflow velocity of the nozzle, that is to say, the relative velocity of the nozzle 8 to the multi-layer system 14, the powder conveyor rate or respectively the speed of the powder conveyor, the spacing distance of the nozzle 8, or respectively of the nozzle end relative to the surface of the layer system 14, the powder-particle-size distribution, the carrier-gas used and the particles used.

With a particularly advantageous selection of the parameters, a required contact element 5 is formed. The optimal parameters in this context are the use of aluminium particles with a carrier gas $N_2$. However, copper, silver, tin, zinc, nickel, titanium or alloys of the named materials can also be used as the particles. As already explained, nitrogen, but also argon, helium and air, and mixtures thereof can be considered as carrier gases.

Values from 100° C. to 500° C. can be used as the carrier-gas temperature, A carrier-gas temperature of 400° C. has proved optimum. The overflow velocity of the nozzle is 8 to 12 meters per minute and advantageously 10 meters per minute. The speed of the powder conveyor is 3 to 5 revolutions per minute and advantageously four revolutions per minute, or respectively, the powder conveyor rate is 5 to 70 g/min, preferably 10 to 20 g/min. The optimum spacing distance of the nozzle end of the nozzle relative to the surface of the top-layer system 4 is 20 to 30 mm and advantageously 25 mm.

Possible values for the carrier-gas pressure are within the range from 5 to 30 bar, by preference, 5 to 25 bar. In this context, a value of 15 bar has proved particularly advantageous. As a criterion for an appropriate contact element 5, the resistance of the contact element and the resistance between two contact elements was used in this context. Good values were obtained here with a pressure of 15 bar, and similarly with a pressure of 20 bar. With a pressure of 25 bar, the resistance of the contact elements rises significantly, for which reason a pressure of 25 bar is less suitable.

Figure 4:
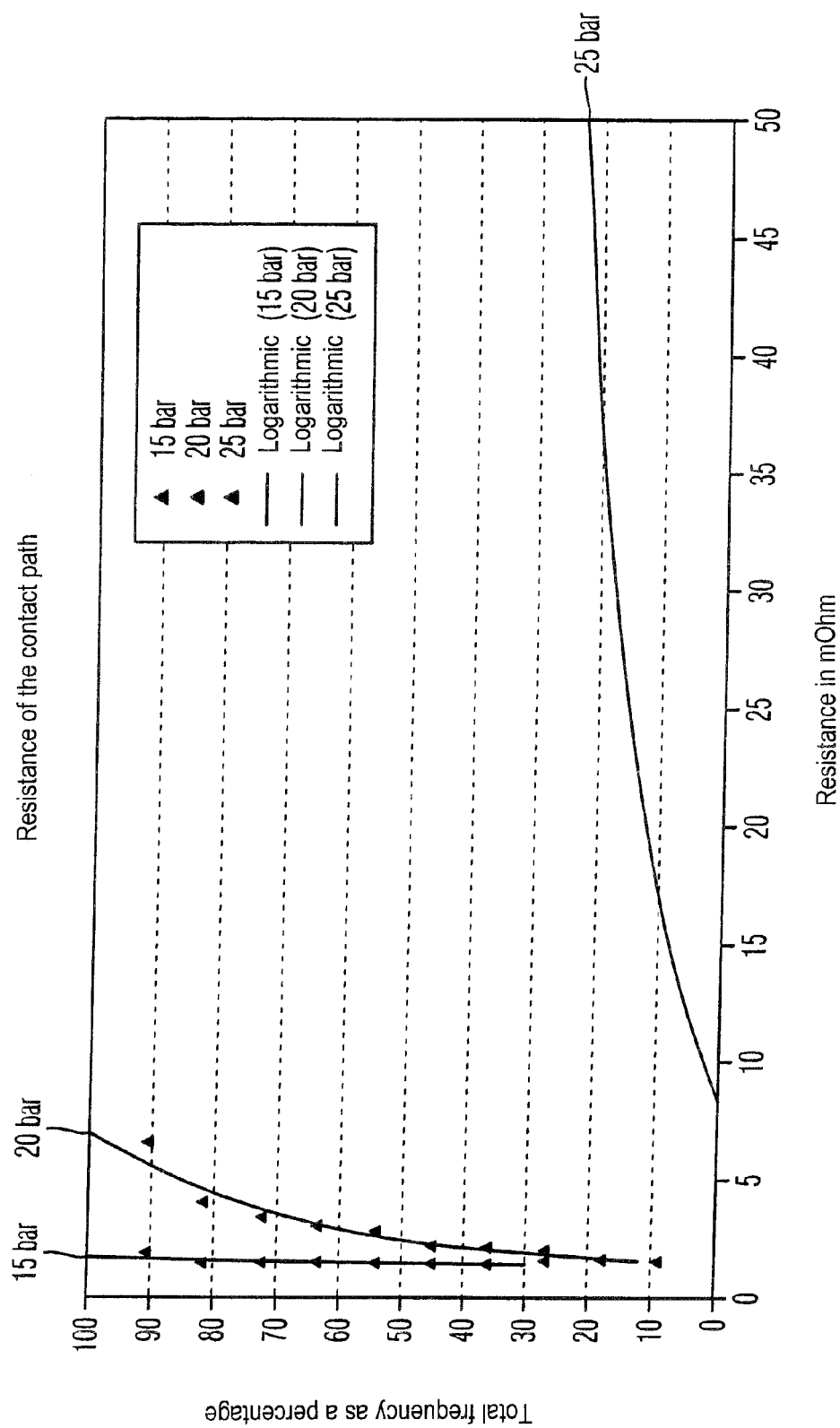
FIG. 4 shows a diagram with different resistance values of a contact element according to the present invention.

FIG. 4 shows a diagram of the resistances of the contact elements. In this context, aluminium contact elements were applied to a multi-layer system 14, so that a silver layer was contacted. In the diagram, which is shown on a logarithmic scale, the resistance is shown in mOhm along the x-axis, and the total frequency is indicated along the y-axis as a percentage. Three curves are shown here for three different values of the carrier-gas pressure. As shown in FIG. 4, good resistance values are obtained for a carrier-gas pressure of 15 bar and 20 bar. By contrast, the resistance of the contact element rises from a pressure of 25 bar.

Figure 5:
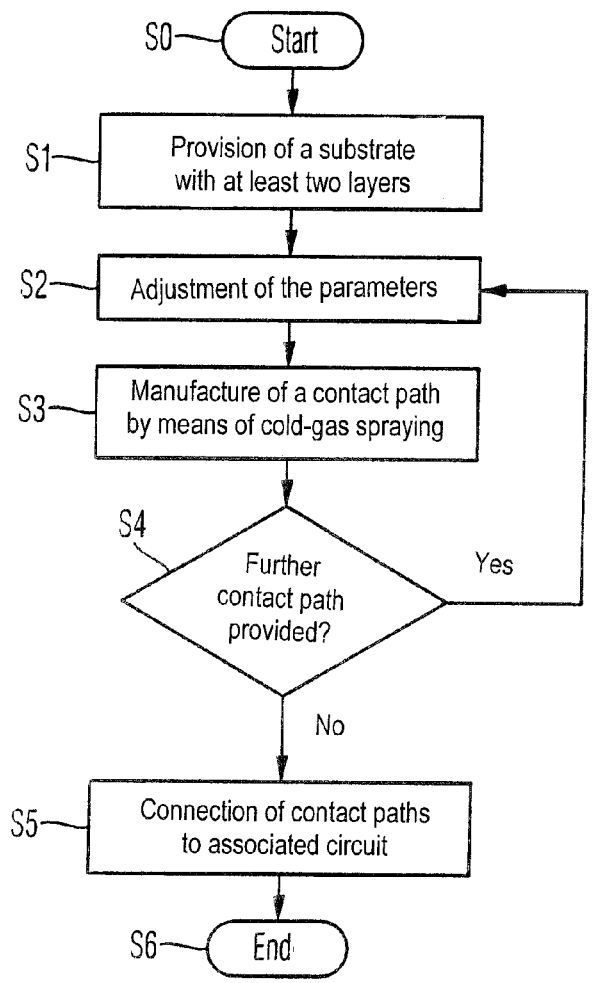
FIG. 5 shows a flow chart with the method steps of the manufacturing method according to the present invention.

FIG. 5 shows, once again schematically, the steps for applying a contact element to a multi-layer system 14 according to the method of the present invention. The process starts in step S0. In the next step S1, a substrate with at least two layers is provided, that is, a substrate, on which an upper layer and a lower layer have been applied. As already explained, only the relative arrangement of the layers relative to one another is relevant here, and it is possible to provide no further layers, or one or more layers in each case between the named layers.

In the following step S2, the parameters for the device for cold-gas spraying 13 are adjusted. In the next step S3, a contact element 5 is constructed by cold-gas spraying. After the construction of the contact element 5, in the next step S4, a check is carried out to determine whether further contact elements are provided. If this is not the case, the contact elements 5 constructed can be connected in a subsequent step S5 to an associated circuit dependent upon the application required.

Otherwise, if it is determined in step S4, that further contact elements are provided, the process returns to step S2, where once again the parameters are adjusted in order to apply a further contact element. This process ends in step S6.

Figure 6:
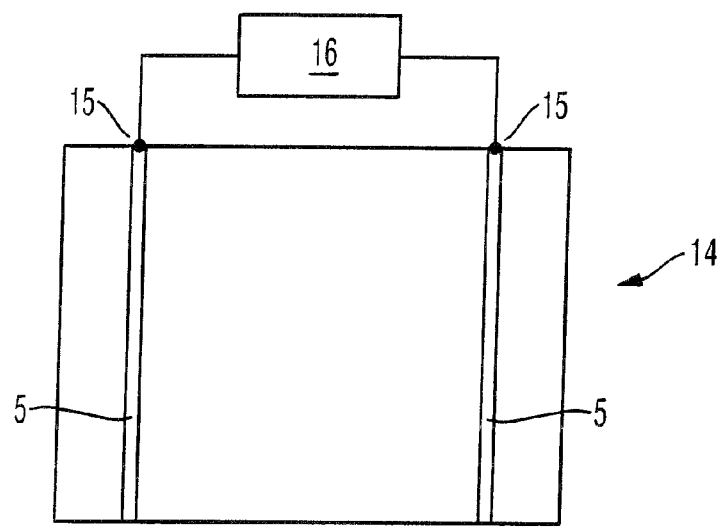
FIG. 6 shows a multi-layer system with contact elements according to the present invention.

FIG. 6 shows schematically a plan view of a system 14, to which two contact elements 5 have been applied.

The contact elements 5 are advantageously applied to the system 14 as narrow strips or paths. However, a full surface application or otherwise arranged application of contact elements 5 is also possible. In particular, a point or circular shape of the contact element 5 is also possible. In one further embodiment, the contact element 5 can cover the multi-layer system 14 completely, so that the contact element 5 at the same time represents a top layer of the multi-layer system 14. If several contact elements 5 are provided, the individual elements can also provide different shapes. Moreover, the present invention is not restricted to the provision of two contact elements 5.

As shown by way of example in FIG. 6, two contact element strips have been applied to the system 14. These contact elements 5 can be contacted via contact points 15, so that a corresponding circuit 16 can be connected to the contact elements 5. As already explained in the introduction, this circuit 16 can allow different applications.

For example, a surface heating of a glass pane can be implemented via the circuit 16. The present invention can be used in various fields in the contacting of surface glass applications, for example, in the case of luminous layers, films or similar layer systems. Furthermore, a burglar proofing can be provided, or the system 14 with the contact element 5 can be provided as part of a photovoltaic cell, as will be explained in greater detail below.

Figure 7:
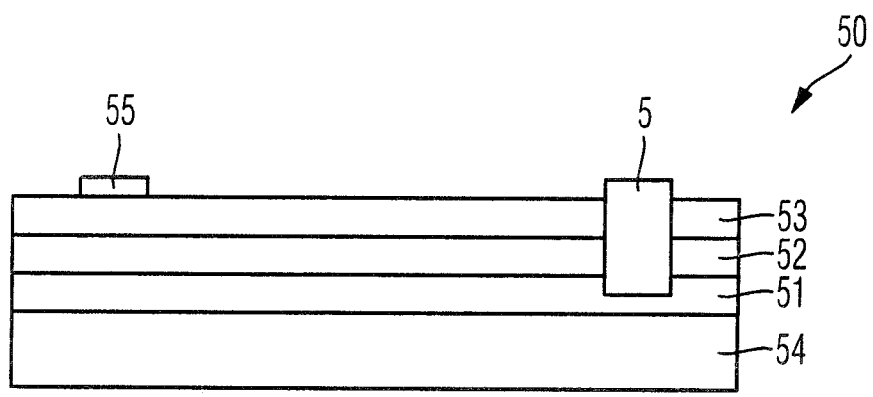
FIG. 7 shows a photovoltaic cell with a contact element according to the present invention.

In the case of photovoltaic cells, a solar-active layer is generally applied between the contact layers. The simplified structure of a photovoltaic cell 50 will now be explained in greater detail with reference to FIG. 7.

On a substrate 54 or a superstrate 54, a first contact layer 51 and a second contact layer 53 is provided with a solar-active layer 52 disposed between the contact layers 51, 53. Moreover, further intermediate layers and/or a top layer can be provided, and the layers applied can each consist of several partial layers.

According to the present invention, a contact element 5 is applied to the layer system, which penetrates at least the solar-active layer 52 and contacts the more deeply disposed contact layer, which, in the present example, is the first contact layer 51. If the second contact layer 53 is at the same time the top layer, a contact point 55 can be applied using conventional methods. Otherwise, if another top layer is disposed above the second contact layer 53, the second contact layer 53 can also be contacted by means of a contact element according to the invention. Dependent upon whether the photovoltaic cell 50 is provided with a substrate or a superstrate, the first contact layer 51 is contacted by means of the contact element 5, and the second contact layer 53 is penetrated, or vice versa. In every case, however, the contact element penetrates the solar-active layer 52 and contacts at least one more deeply disposed contact layer.

With the use of a superstrate 54, the orientation is arranged with the superstrate 54 towards the light source or the sun; with the structure as a substrate 54, the orientation of the substrate 54 is arranged away from the light source or respectively the sun.

Examples of the material for the solar-active layer 52 are, for example, amorphous silicon, micromorphous silicon, tandem cells based on amorphous silicon, CdTe, so-called CIS cells based on copper, indium, gallium, selenium and/or sulphur, or other materials, which provide solar-active properties.

For the contacting and conduction of the electrical current generated, the first contact layer 51 and the second contact layer 53 are connected conventionally to electrically conductive cables. The contacting is implemented conventionally by soldering, which can be problematic especially on thin-layer cells with the materials used. The contacting of the more deeply disposed first contact layer 51 is frequently implemented according to the known methods via contact strips previously applied directly onto the substrate or superstrate, which are then coated.

By contrast, the retrospective contacting of the first lower contact layer 51 and, if a further, top layer is provided above the second contact layer 53, also the retrospective electrical contacting of the second contact layer 53, is made possible according to the present invention. Following this, the connection to the electric cable can be implemented by soldering to the contact element 5 according to the invention. The present invention can be used in particular in the edge region of thin-layer cells. As a result, the manufacture of photovoltaic cells is simplified and damage, for example, through thermal stress in the electrical contacting of the contact layers 51, 53, is avoided.

The present invention therefore provides a multi-layer system with contact element 5, in which an electrical contacting of intermediate layers within the system 14 is possible. Moreover, the present invention discloses a method for the construction of a contact element for a multi-layer system, which makes possible the contacting of more deeply disposed layers even after the construction of a multi-layer system 14. Providing the contact element 5 also on the surface of the multi-layer system 14 allows an easy contacting or respectively an easy connection of the contact element 5 to further components and/or circuits.

The present invention can be used on any type of multi-layer system with at least one electrically conductive layer. The electrically conductive layer can be metallic or based on transparent conducting oxides, so-called TCOs (transparent conducting oxides). In the case of several electrically conductive layers within a multi-layer system, the electrically conductive layers can either be metallic and/or based upon TCOs. The present invention relates in particular to multi-layer systems in the field of thin-layer technology, display technology, automotive technology or lighting technology. Applications are, for example, glazing, solar cells, displays or similar.

The invention is not restricted to the exemplary embodiments presented. On the contrary, individual features can also be advantageously combined with one another.

The invention claimed is:

1. A method for the construction of a contact element for a layer system, the method comprising the steps of:
   providing a substrate with a multi-layer system disposed on the substrate, the multi-layer system having at least one upper layer and at least one lower layer; and
   applying a contact element by means of cold-gas spraying in such a manner that the contact element penetrates the at least one upper layer and contacts the at least one lower layer,
   wherein the at least one upper layer comprises a scratch-resistant top-layer.

2. The method according to claim 1, wherein the cold-gas spraying uses a device for cold-gas spraying, the device comprising a carrier-gas chamber, a particle chamber, a powder conveyor for the transportation of the particles from the particle chamber into a mixing chamber and a nozzle for the application of the particle-gas mixture from the mixing chamber onto the multi-layer system.

3. The method according to claim 2, wherein in the step of applying a contact element, a carrier gas comprises nitrogen $N_2$.

4. The method according to claim 2, wherein the step of applying a contact element comprises providing aluminium particles as powder.

5. The method according to claim 2, wherein in the step of applying a contact element, a carrier-gas has a temperature from 100° C. to 500° C.

6. The method according to claim 2, wherein a carrier-gas has a pressure of 5 bar to 30 bar.

7. The method according to claim 2, wherein in the step of applying a contact element, the nozzle of the device for cold-gas spraying has a relative velocity relative to the substrate with the multi-layer system of 10 m/min.

8. The method according to claim 2, wherein in the step of applying a contact element, a powder conveyor rate of the device for cold-gas spraying is in a range of 5 to 70 g/min.

9. The method according to claim 2, wherein in the step of applying a contact element, a spacing distance between the nozzle of the device for cold-gas spraying and the multi-layer system is in a range of 20 mm to 30 mm.

10. The method according to claim 5, wherein in the step of applying a contact element, said carrier-gas temperature is 400° C.

11. The method according to claim 6, wherein in the step of applying a contact element, said carrier-gas pressure is from 5 bar to 25 bar.

12. The method according to claim 6, wherein in the step of applying a contact element, said carrier-gas pressure is 15 bar.

13. The method according to claim 8, wherein in the step of applying a contact element, said powder conveyor rate of the device for cold-gas spraying is from 10 to 20 g/min.

14. The method according to claim 9, wherein in the step of applying a contact element, said spacing distance between the nozzle of the device for cold-gas spraying and the multi-layer system is 25 mm.

* * * * *